United States Patent [19]

Satoh et al.

[11] Patent Number: 4,905,068

[45] Date of Patent: Feb. 27, 1990

[54] SEMICONDUCTOR DEVICE HAVING INTERCONNECTION LAYERS OF T-SHAPE CROSS SECTION

[75] Inventors: Shinichi Satoh; Makoto Hirayama; Masao Nagatomo; Ikuo Ogoh; Yoshikazu Ohno; Masato Fujinaga, all of Hyogo, Japan

[73] Assignee: Mitsubishi Denki Kabushiki Kaisha, Tokyo, Japan

[21] Appl. No.: 143,400

[22] Filed: Jan. 13, 1988

[30] Foreign Application Priority Data

Mar. 10, 1987 [JP] Japan .................. 62-55904

[51] Int. Cl.[4] .............................. H01L 23/48
[52] U.S. Cl. ...................... 357/68; 357/23.6; 357/54; 357/71
[58] Field of Search .............. 357/71, 23.6, 23.5, 357/51, 54, 68, 59

[56] References Cited

U.S. PATENT DOCUMENTS 4,476,959  5/1988  Mueller ............................. 357/23.6
4,488,166 12/1984  Lehrer ............................... 357/59 I
4,617,193 10/1986  Wu .................................... 357/71

FOREIGN PATENT DOCUMENTS 0160392 11/1985 European Pat. Off. .
3634167  4/1987 Fed. Rep. of Germany .
3635259  4/1987 Fed. Rep. of Germany .
60-229374 11/1985 Japan ........................... 357/23.3

OTHER PUBLICATIONS

F. Mohammadi "Silicides for Interconnection Technology" Solid State Technology (Jan. 1981), pp. 65-72, 92.
D. S. Yaney et al., "Technology for the Fabrication of A 1 MB CMOS DRAM" IEDM 1985 (1985), pp. 698-701.
E. T. Lewis "An Analysis of Interconnect Line Capacitance and Coupling for VLSI-Circuits" Solid-State Electronics, vol. 27, Nos. 8/9, pp. 741-749 (1984).
J. Summers "Interconnecting High Speed Logic" Electronic Engineering (Mar. 1985), pp. 133-140.

Primary Examiner—Andrew J. James
Assistant Examiner—Mark Prenty
Attorney, Agent, or Firm—Lowe, Price, LeBlanc, Becker & Shur

[57] ABSTRACT

A cell plate (6) is formed on a main surface of a semiconductor substrate (7) with an insulating film (8) interposed therebetween and an interconnection (1) having T-shape cross section is formed on the cell plate (6) with an interlayer insulating film (11) interposed therebetween. An upper insulating film (12) is formed to cover the interconnection (1).

13 Claims, 4 Drawing Sheets

SEMICONDUCTOR DEVICE HAVING INTERCONNECTION LAYERS OF T-SHAPE CROSS SECTION

BACKGROUND OF THE INVENTION

1. Field of the Invention

The present invention relates to the interconnecting structure of a semiconductor device and, more specifically, it relates to the cross sectional shape of the interconnection formed on the semiconductor with an insulating film interposed therebetween.

2. Description of the Prior Art

FIG. 1 is a plan view showing the memory portion of a dynamic MOS RAM (random access memory) having a folded bit line structure.

In the figure, the random access memory comprises an active region 4 for storing charges representing information, bit lines 1 formed of a first aluminum interconnecting layers electrically connected with the active region 4 through a contact 5, a cell plate 6 which is to be one electrode of the memory cell capacitor for storing charges representing information and word lines 3 for controlling the reading/writing operation of information represented by charges in the memory cell. A field oxide film is provided between adjacent active regions and the regions are electrically insulated from each other. Namely, the field oxide film is formed around the active region 4. The cell plate 6 is formed outside of the region which is surrounded by the dot-and-dash line, that is, on the field oxide film. In that region where the cell plate 6 is not formed, an MOS transistor having the word line 3 serving as a gate electrode is formed and that region serves as the transfer gate at the time of reading/writing the signal charge. In the folded bit line structure shown in the figure, two bit lines constitute a pair of bit line pair, and one memory cell is connected to every each bit line for one word line.

Description will be given of the information reading operation as an example.

First, one word line is selected and the information stored in the memory cell connected to the said word line 3 is read to the bit line 1. In the folded bit line structure, normally the potential difference between the bit line to which the selected memory cell is connected and the bit line to which the non-selected memory cell is connected (hereinafter referred to as complementary bit line) in one bit line pair is detected to read out the information. Namely, a reference potential appears on the complementary bit line and the potential corresponding to the information stored in the memory cell appears on the selected bit line. The potential difference between bit line and the reference potential on the complementary bit line is enlarged to read out the information.

In the normal reading operation of information, an input signal is applied to one word line 3 to activate the transistor, charges stored in the memory cell is read to the bit line 1 through the contact 5 and this is detected as the amount of potential change, that is, the output signal, in the sense amplifier (not shown) connected to the bit line 1. In this operation, the influences exerted on the output signals by the input signal (from the transistor) due to the length of the interconnection of the bit line 1 from the contact 5 to the sense amplifier cannot be neglected in the device in which the high speed operation is required.

FIG. 2 shows the relation of the operation delay between the input signal and the output signal.

Referring to the figure, the input signal changed from the low level $V_L$ to the high level $V_H$ and the corresponding conversion operation of the output signal from the low level $V_L$ to the high level $V_H$ is shown. As is apparent from the figure, the output signal is not changed immediately from $V_L$ to $V_H$ but is gradually changed to $V_H$ in a certain period time t. Namely, the input signal appears as an output signal after the operation delay by the time t. This time delay is proportional to the time constant ($R \times C$ = resistance × capacitance) of the bit line 1, so that this constant should be made small in order to increase the speed of operation of the device. However, as the device has come to be smaller, the interconnections become thinner and, in addition, the routing of the interconnections are carried out making the interconnections longer. Therefore, the resistance R seems to be increasing.

On the other hand, the presence or absence of the output signal is detected in the sense amplifier as the amount of potential change, as described above. Assuming that the bit line capacitance is $C_B$ and the memory cell capacitance is $C_S$, the amount of change in the potential appearing at the bit line 9 is a very small value given by $C_S/C_B$. The bit line capacitance $C_B$ includes the interconnecting capacitance of the bit line itself and the floating capacitance parasitic thereto. The increase in the parasitic capacitance, and therefore the increase in the bit line capacitance $C_B$ extremely reduces the amount of potential change appearing at the bit line 1, making the accurate reading of information difficult.

In view of the foregoing, the decrease of the parasitic capacitance in the interconnecting structure is quite important for the operation characteristics in general and for the accurate reading of the information in the random access memory and the like.

FIG. 3 is a cross sectional view taken along the line III—III of FIG. 1, and FIG. 4 is the cross sectional view taken along the line IV—IV of FIG. 1.

The cross sectional structure will be hereinafter described with reference to FIGS. 3 and 4.

A source region (or a drain region) 9 and a drain region (or a source region) 10 are formed in the field region of a semiconductor substrate 7 and a cell plate 6 which is to be a capacitor is formed on a portion of the drain region 10 with an insulating film 8 interposed therebetween. A word line 3 which is to be a gate electrode of a switching transistor is formed on that portion between the source region 9 and the drain region 10 which is to be a channel region with an insulating film interposed therebetween and, in addition, a bit line 1 is connected to the source region 9 through a contact 5. The bit line 1 is formed on an interlayer insulating film 11 which is formed to smooth the step on the semiconductor substrate 7 and, an upper insulating film 12 is formed on the entire surface in order to protect the surface of the device. Referring to FIG. 3, parasitic capacitances of the bit line 1 are generated in various portions (reference should be made to the dotted lines). For example, the parasitic capacitances are generated between the bit line 1 and the word line 3, between the bit line 1 and the drain region 10, between the bit line 1 and the cell plate 6, and so on.

Meanwhile, the higher the dynamic RAM becomes integrated, the smaller the device, specifically the memory cell, becomes, and the thinner the interlayer insulating films become between the interconnections, the larger the capacitance of the bit line becomes. If the thickness of the bit line is increased to reduce the area of the lower portion to cope with this situation, the thickness makes the minute processing difficult and, if the width is enlarged to facilitate the minute processing, the capacitances between the cell plate 6 and the bit line 1 or between the bit lines 1 are increased as shown in FIG. 4

As described above, the parasitic capacitance of the bit lines or the like presents an extremely serious problem in increasing the speed of operation and in high integration of the dynamic RAM.

An interconnecting structure of a CMOS DRAM in which the bit line is formed of aluminum and the word line is formed of the two-layer of TaSi$_2$/Polysilicon is disclosed in "TECHNOLOGY FOR THE FABRICATION OF A 1 MB CMOS DRAM" by D. S. Yaney et al., 1985 IEDM Technical Paper, pp. 698–701.

However, the disclosure in the above mentioned literature neither decreases the parasitic capacitance of the interconnections nor suggests any method for decreasing the parasitic capacitance. The disclosure does not eliminate the problem which is to be solved by the present invention.

SUMMARY OF THE INVENTION

A main object of the present invention is to provide an interconnecting structure of a semiconductor device which is capable of decreasing the parasitic capacitance of the bit lines and the like without changing the interconnecting resistance thereof.

In order to attain the above described object, the interconnecting structure of the semiconductor device according to the present invention comprises interconnections formed on a conductor with an insulating film interposed therebetween with the cross section of the interconnection being T-shape with respect to the conductor. According to the present invention, since the interconnection has a T-shape cross section, the parasitic capacitance thereof can be decreased without changing the interconnecting resistance corresponding to the dielectric constant and the film thickness of the insulating film.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
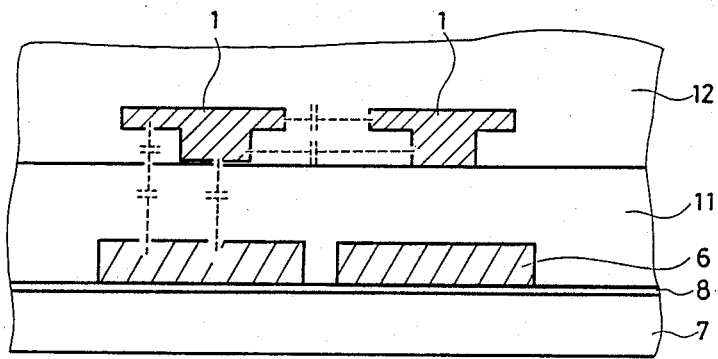
FIG. 5 shows the cross section of the interconnection having T-shape according to one embodiment of the present invention, showing the parasitic capacitances generated between the interconnections and between the interconnection and the cell plate.

FIG. 5 shows the cross section of the interconnection having T-shape according to one embodiment of the present invention.

Figure 1:
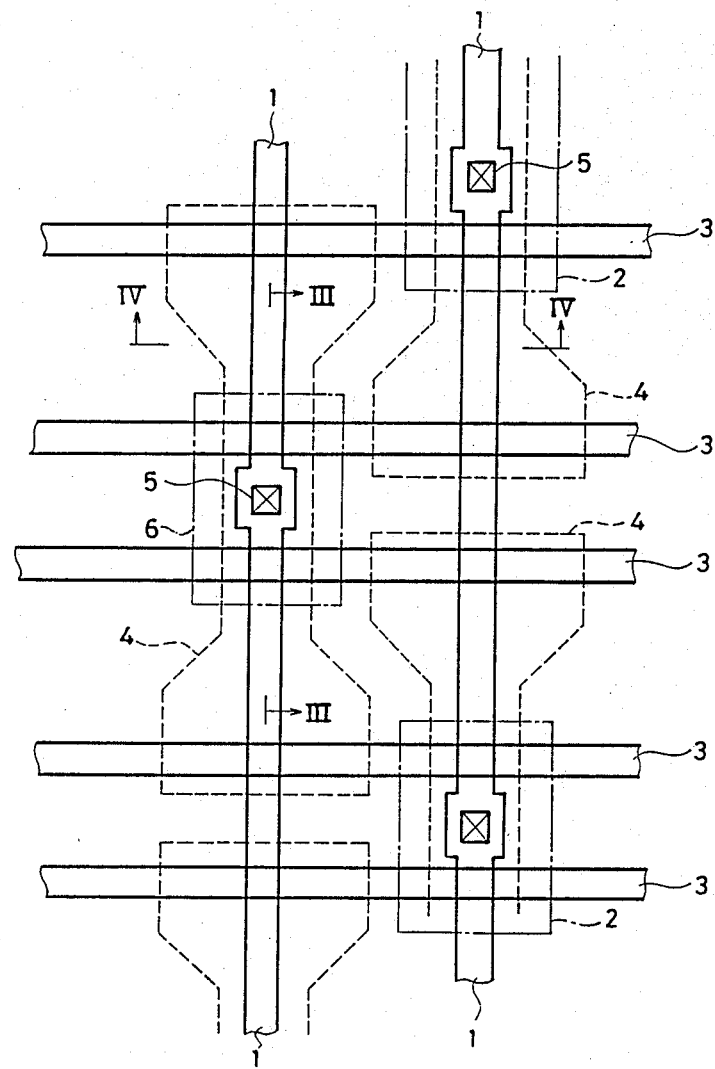
FIG. 1 is a plan view of the memory portion of a dynamic RAM which is a background of the present invention, showing a typical layout of the interconnecting structure.
Figure 2:
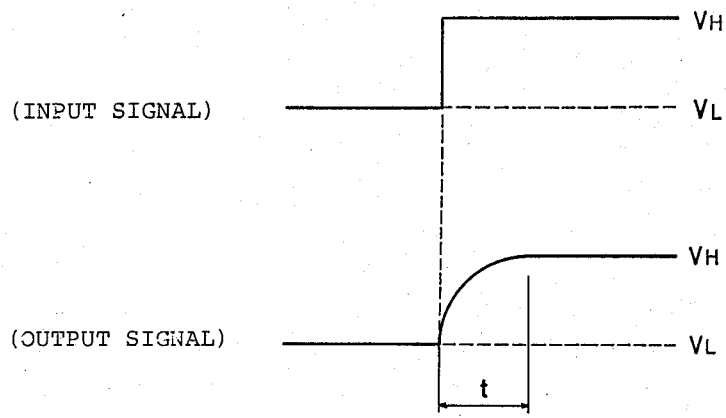
FIG. 2 shows the relation of the operation delay between the input signal and the output signal with respect to a general interconnection.
Figure 3:
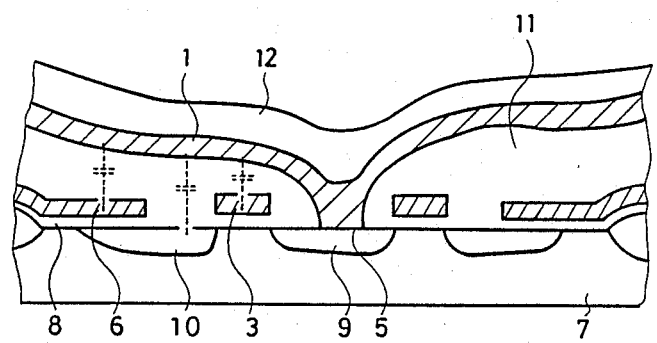
FIG. 3 is a cross sectional view taken along the line III—III of FIG. 1, showing the representative positions where the parasitic capacitances are generated in the bit lines around the memory cell portion.
Figure 4:
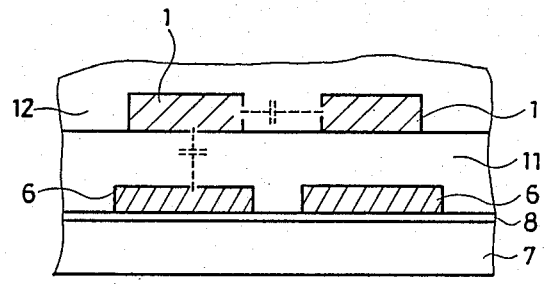
FIG. 4 is a cross sectional view taken along the line IV—IV of FIG. 1, showing the parasitic capacitances generated between the bit lines and between the bit line and the cell plate.

This figure corresponds to FIG. 4 of the conventional device. An insulating film 8, a cell plate 6 and an interlayer insulating film 11 are laminated on the semiconductor substrate 7, a bit line 1 formed of, for example, aluminum is formed thereon and an upper insulating film 12 covers the entire surfaces. Since the cross section of the bit line 1 is T-shape, the capacitances are generated separately in the upper portion and the lower portion (reference should be made to the dotted lines).

Figure 6:
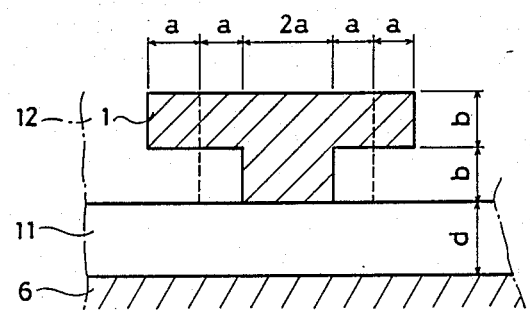
FIG. 6 is a schematic cross sectional view describing the parasitic capacitance decreasing effect of the interconnections having T-shape cross section according to the present invention.

FIG. 6 is a schematic cross sectional view describing the capacitance decreasing effect of the T-shape cross section.

The capacitance decreasing effect will be hereinafter described compared with the conventional structure, with reference to the figures.

For simplicity, the description will be made of a model having the dimensions shown in the figures. Namely, the dimension of the conventional rectangular bit line is supposed to be $4a \times 2b$ (reference should be made to the dotted lines) and the T-shape cross section has the same cross sectional area ($6a \times b + 2a \times b$) to have the same interconnecting resistance. Let us assume that the thickness of interlayer insulating film 11 formed on the cell plate 6 is d, dielectric constant (permittivity) is $\epsilon_1$ and the dielectric constant of the upper insulating film 12 is $\epsilon_2$, then the capacitance $C_1$ between the cell plate and the conventional bit line will be $$C_1 = \epsilon_1 \times 4a/d$$

The capacitance $C_2$ of the bit line having T-shape cross section of the present invention is the sum of the capacitance $C_{U2}$ in the upper portion thereof and the capacitance $C_{L2}$ in the lower portion thereof.

$$C_2 = C_{U2} + C_{L2} = \frac{1}{\frac{d}{\epsilon_1 4a} + \frac{b}{\epsilon_2 4a}} + \frac{\epsilon_1 2a}{d}$$

$$= \frac{\epsilon_1 E_2 4a}{\epsilon_1 b + \epsilon_2 d} + \frac{\epsilon_1 2a}{d}$$

Assuming the $C_1 > C_2$, $$\frac{\epsilon_1 2a}{d} > \frac{\epsilon_1 \epsilon_2 4a}{\epsilon_1 b + \epsilon_2 d}$$

Therefore, $\epsilon_2$ and b should be set to satisfy the above expression.

Now, if b=d, then, $$\frac{1}{2} > \frac{\epsilon_2}{\epsilon_1 + \epsilon_2}$$

Therefore, if the dielectric constant $\epsilon_2$ of the upper insulating film 12 is smaller than the dielectric constant $\epsilon_1$ of the interlayer insulating film 11, then, the capacitance in the present invention is decreased compared with the conventional capacitance.

In addition, if $\epsilon_1 = \epsilon_2$, then, $$\frac{1}{d} > \frac{2}{b+d}$$

Therefore, the capacitance will be decreased compared with the capacitance in the conventional device by making the T-shape cross section in which the thickness of the upper insulating film 12 under the upper portion of the T-shape is larger than the thickness of the interlayer insulating film 11.

Consequently, by considering the dielectric constant of the upper insulating film and the concrete dimensions of the T-shape, the interconnecting capacitances of the T-shape cross section can be decreased compared with the conventional one.

Figure 7:
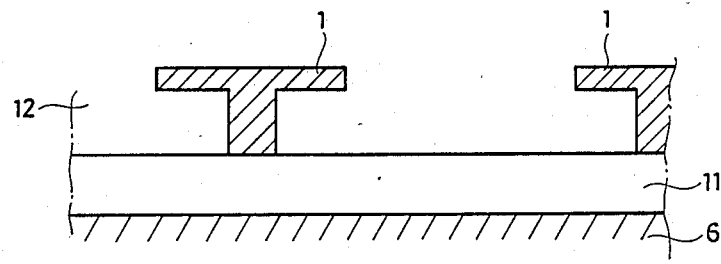
FIG. 7 shows a cross section of the interconnections having T-shape according to another embodiment of the present invention, showing the cross sections of interconnections in case sufficient distances are provided between interconnections.

FIG. 7 shows the cross sections of the bit lines in which there are sufficient distances between the bit lines according to another embodiment of the present invention.

As shown in FIG. 5, the capacitances of the bit line exist not only between the bit line and the electrode but also between the bit lines. Therefore, if there is enough distance between each of the bit lines, the capacitances are effectively decreased by widening the upper portion of the T-shape in combination with the dielectric constant of the upper insulating film 12.

The method for manufacturing such interconnections having T-shape cross sections or gate electrodes are widely known and disclosed in, for example, "Double-Layer Resist Films for Submicrometer Electron-Beam Lighography" by Y. Todokoro, 1980 IEEE VOL. ED-27, No. 8, pp. 1443-1448 and in "Submicrometer Lift-Off Line with T-shaped Cross-Sectional Form" by M. Matsumura et al., 1981 ELECTRONICS LETTERS, VOL. 17, No. 12, pp. 429-430.

Although the bit line of the dynamic RAM is described in the foregoing, the idea of the present invention can be applied to other devices, signal lines including word lines or to general interconnections to obtain the same effect as in the above example.

Although the bit line is made of aluminum in the above embodiment, the material is not limited and it can be made of polycrystalline silicon, metal of high melting point, metal silicide of high melting point or it may have two-layer structure of polycrystalline silicon and the metal of high melting point or the metal silicide of high melting point.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An interconnecting structure of a semiconductor device comprising:
   a conductor;
   an insulating film formed on said conductor; and
   an interconnection layer electrically insulated from said conductor, said interconnection layer formed on said insulating film and having T-shape cross section comprising a vertical portion above and overlapping said conductor and a horizontal portion in relation to said conductor, upper surfaces of said vertical and horizontal portions of said interconnection layer lying in a common plane whereby a low parasitic capacitance exists between said conductor and said interconnection layer.

2. An interconnecting structure of a semiconductor device comprising:
   a conductor;
   an insulating film formed on said conductor; and
   an interconnection layer electrically insulated from said conductor, said interconnection layer formed on said insulating film and having T-shape cross section comprising a vertical portion and a horizontal portion in relation to said conductor whereby a low parasitic capacitance exists between said conductor and said interconnection layer, upper surfaces of said vertical and horizontal portions of said interconnection layer lying in a common plane,
   wherein said insulating film has a two-layer structure comprising a lower insulating film formed below said vertical portion of said interconnection layer and an upper insulating film formed between said lower insulating film and said horizontal portion of said interconnection layer.

3. An interconnecting structure of a semiconductor device comprising:
   a conductor;
   an insulating film formed on said conductor; and
   an interconnection formed on said insulating film and having T-shape cross section comprising a vertical portion and a horizontal portion in relation to said conductor, wherein said insulating film has a two-layer structure comprising a lower insulating film formed below said vertical portion of said interconnection layer and an upper insulating film formed between said lower insulating film and said horizontal portion of said interconnection layer, a film thickness of said upper insulating film substantially equal to a thickness of said lower insulating film and a dielectric constant of said upper insulating film being smaller than a dielectric constant of said lower insulating film.

4. An interconnecting structure of a semiconductor device comprising:
   a conductor;
   an insulating film formed on said conductor; and
   an interconnection formed on said insulating film and having T-shape cross section comprising a vertical portion and a horizontal portion in relation to said conductor, upper surfaces of said vertical and horizontal portions of said interconnection layer lying in a common plane, said insulating film having a two-layer structure comprising a lower insulating film formed below said vertical portion of said interconnection layer and an upper insulating film formed between said lower insulating film and said horizontal portion of said interconnection layer, a dielectric constant of said upper insulating film substantially equal to a dielectric constant of said lower insulating film and a film thickness of said upper insulating film being larger than a film thickness of said lower insulating film.

5. An interconnecting structure of a semiconductor device according to claim 1, wherein said interconnection layer is a signal line.

6. An interconnecting structure of a semiconductor device comprising:
   a conductor;
   an insulating film formed on said conductor; and
   a bit line electrically insulated from said conductor, said interconnection layer formed on said insulating film and having T-shape cross section comprising a vertical portion above and overlapping said conductor and a horizontal portion in relation to said conductor whereby a low parasitic capacitance exists between said conductor and said bit line.

7. An interconnecting structure of a semiconductor device comprising:
   a conductor;
   an insulating film formed on said conductor; and
   an interconnection layer electrically insulated from said conductor, said interconnection layer formed on said insulating film and having T-shape cross section comprising a vertical portion and a horizontal portion in relation to said conductor, upper surfaces of said vertical and horizontal portions of said interconnection layer lying in a common plane whereby a low parasitic capacitance exists between said conductor and said interconnection layer, wherein said interconnection layer is a word line.

8. An interconnecting structure of a semiconductor device according to claim 1, wherein said interconnecton layer is made of aluminum.

9. An interconnecting structure of a semiconductor device according to claim 1, wherein said interconnection layer is made of a member selected from the group consisting of polycrystalline silicon, a metal having a high melting point and a metal silicon having a high melting point.

10. An interconnecting structure of a semiconductor device according to claim 1, wherein said interconnection layer has a two-layer structure comprising the polycrystalline silicon and the metal having a high melting point or metal silicide having a high melting point.

11. An interconnecting structure of a semiconductor device according to claim 1, wherein said insulating film is an oxide film.

12. An interconnecting structure of a semiconductor device comprising:
    a conductor;
    an insulating film formed on said conductor; and
    an interconnection formed on said insulating film and having T-shape cross section comprising a vertical portion above and overlapping said conductor and a horizontal portion in relation to said conductor, wherein said semiconductor device comprises a dynamic RAM and said conductor is a cell plate constituting said dynamic RAM.

13. An interconnecting structure of a semiconductor device comprising:
    a conductor;
    an insulating film formed on said conductor; and
    an interconnection formed on said insulating film and having T-shape cross section comprising a vertical portion above and overlapping said conductor and a horizontal portion in relation to said conductor, wherein said semiconductor device comprises a dynamic RAM having a switching transistor and said conductor is a gate electrode constituting said switching transistor of said dynamic RAM.

* * * * *